United States Patent
Xu (10) Patent No.: US 9,267,979 B2
(45) Date of Patent: Feb. 23, 2016

(54) LINE TESTING DEVICE FOR ARRAY SUBSTRATE HAVING DENSE NUMBER OF WIRES AND METHOD FOR TESTING LINE OF THE ARRAY SUBSTRATE HAVING THE DENSE NUMBER OF WIRES

(71) Applicant: SHENZHEN CHINA STAR OPTOELECTRONICS TECHNOLOGY CO., LTD, Shenzhen (CN)

(72) Inventor: Xiangyang Xu, Shenzhen (CN)

( * ) Notice: Subject to any disclaimer, the term of this patent is extended or adjusted under 35 U.S.C. 154(b) by 129 days.

(21) Appl. No.: 14/241,081

(22) PCT Filed: Jan. 13, 2014

(86) PCT No.: PCT/CN2014/070522
§ 371 (c)(1),
(2) Date: Feb. 26, 2014

(87) PCT Pub. No.: WO2015/100792
PCT Pub. Date: Jul. 9, 2015

(65) Prior Publication Data
US 2015/0309102 A1      Oct. 29, 2015

(30) Foreign Application Priority Data
Dec. 31, 2013   (CN) .......................... 2013 1 0753642

(51) Int. Cl.
*G01R 31/02*   (2006.01)
*G01R 31/28*   (2006.01)

(52) U.S. Cl.
CPC .......... *G01R 31/021* (2013.01); *G01R 31/2813* (2013.01); *G01R 31/2851* (2013.01)

(58) Field of Classification Search
None
See application file for complete search history.

(56) References Cited

U.S. PATENT DOCUMENTS

| | | | | |
|---|---|---|---|---|
| 4,823,078 A | * | 4/1989 | Mohebban | G01R 19/155 324/133 |
| 5,081,687 A | * | 1/1992 | Henley | G01R 31/316 345/87 |
| 5,285,150 A | * | 2/1994 | Henley | G01R 31/308 324/73.1 |
| 5,465,052 A | * | 11/1995 | Henley | G11C 29/50 324/760.02 |
| 5,546,013 A | * | 8/1996 | Ichioka | G09G 3/006 324/760.02 |
| 5,790,212 A | * | 8/1998 | Lim | G02F 1/1362 349/139 |
| 5,852,480 A | * | 12/1998 | Yajima | G02F 1/136204 349/39 |

(Continued)

FOREIGN PATENT DOCUMENTS

| | | |
|---|---|---|
| CN | 1673765 A | 9/2005 |
| CN | 1700026 A | 11/2005 |

(Continued)

OTHER PUBLICATIONS

Ding Peng, the International Searching Authority written comments, Sep. 2014, CN.

*Primary Examiner* — Jermele M Hollington
*Assistant Examiner* — Suresh K Rajaputra (57) ABSTRACT

A line testing device for an array substrate having a dense number of wires includes a signal generating device that generates a detection signal, a signal receiving device that receives and processes the detection signal, and a control device. The detection signal tests the array substrate having the dense number of wires, and the control device controls one or more of the signal generating device and the signal receiving device to move in a direction perpendicular to a direction of a scan line of the array substrate and in a plane parallel to the array substrate.

9 Claims, 8 Drawing Sheets

(56) References Cited

U.S. PATENT DOCUMENTS

| | | | | |
|---|---|---|---|---|
| 5,909,035 A * | 6/1999 | Kim | G02F 1/136204 | 257/350 |
| 5,936,687 A * | 8/1999 | Lee | G02F 1/136204 | 345/69 |
| 5,999,012 A * | 12/1999 | Listwan | G01N 21/95 | 324/754.23 |
| 6,392,719 B2 * | 5/2002 | Kim | G02F 1/136204 | 349/192 |
| 6,781,403 B2 * | 8/2004 | Kim | G09G 3/006 | 324/750.3 |
| 6,801,265 B2 * | 10/2004 | Choi | G02F 1/1309 | 349/139 |
| 7,038,484 B2 * | 5/2006 | Harada | G09G 3/3611 | 324/750.3 |
| 7,683,606 B2 * | 3/2010 | Kang | G02F 1/133305 | 324/754.23 |
| 7,714,589 B2 * | 5/2010 | Jun | G09G 3/006 | 324/527 |
| 8,508,457 B2 * | 8/2013 | Kretz | G09G 3/20 | 345/100 |
| 2002/0075419 A1 * | 6/2002 | Kwon | G02F 1/136204 | 349/40 |
| 2004/0222816 A1 * | 11/2004 | Bae | G09G 3/006 | 324/760.01 |
| 2006/0043153 A1 * | 3/2006 | Yamaoka | G01R 31/2805 | 228/10 |
| 2007/0046316 A1 * | 3/2007 | Uei | G09G 3/006 | 324/760.01 |
| 2007/0158812 A1 * | 7/2007 | Sagiyama | G09G 3/006 | 257/686 |
| 2008/0094081 A1 * | 4/2008 | Nguyen | G09G 3/006 | 324/750.19 |
| 2008/0129327 A1 * | 6/2008 | Kim | G02F 1/1309 | 324/750.3 |
| 2008/0180592 A1 * | 7/2008 | Yu | G09G 3/006 | 349/54 |
| 2008/0265250 A1 * | 10/2008 | Huang | G02F 1/136204 | 257/48 |
| 2008/0316416 A1 * | 12/2008 | Chang | G02F 1/133382 | 349/150 |
| 2009/0185106 A1 * | 7/2009 | Lee | G02F 1/1339 | 349/61 |
| 2009/0243972 A1 * | 10/2009 | Her | G09G 3/20 | 345/55 |
| 2010/0066383 A1 | 3/2010 | Chung et al. | | |
| 2010/0219853 A1 * | 9/2010 | Cho | G09G 3/006 | 324/760.01 |
| 2011/0050756 A1 * | 3/2011 | Cassidy | G09G 3/20 | 345/690 |
| 2011/0273640 A1 * | 11/2011 | Zhang | G02F 1/1309 | 349/43 |
| 2012/0262184 A1 * | 10/2012 | Shen | G09G 3/006 | 324/537 |
| 2013/0082990 A1 * | 4/2013 | Her | G09G 5/00 | 345/206 |
| 2014/0145744 A1 * | 5/2014 | Shen | G09G 3/006 | 324/760.02 |
| 2014/0347593 A1 * | 11/2014 | Han | G02F 1/1309 | 349/54 |

FOREIGN PATENT DOCUMENTS

| | | |
|---|---|---|
| CN | 1831550 A | 9/2006 |
| CN | 101281073 A | 10/2008 |
| CN | 102788924 A | 11/2012 |
| CN | 103091918 A | 5/2013 |
| CN | 103308817 A | 9/2013 |
| JP | 2010-127829 A | 6/2010 |

* cited by examiner

FIG. 1

(PRIOR ART)

FIG. 2

(PRIOR ART)

LINE TESTING DEVICE FOR ARRAY SUBSTRATE HAVING DENSE NUMBER OF WIRES AND METHOD FOR TESTING LINE OF THE ARRAY SUBSTRATE HAVING THE DENSE NUMBER OF WIRES

TECHNICAL FIELD

The present disclosure relates to testing devices, and more particularly to a line testing device for an array substrate having a dense number of wires and a method for testing a line of the array substrate having the dense number of wires.

BACKGROUND

At present, there are many types of array substrates, where some types of array substrates have a dense number of wires. For the array substrate having the dense number of wires, testing array lines is difficult because clearance between the lines is too small and exceeds a resolution limit of a typical testing device. Furthermore, interference is generated between the wires, which greatly affects detection rate of a problem line.

SUMMARY

The aim of the present disclosure is to provide a line testing device for an array substrate having a dense number of wires and a method for testing a line of the array substrate having a dense number of wires capable of improving detection rate of a problem line.

The aim of the present disclosure is achieved by the following methods.

A line testing device for an array substrate having, a dense number of wires comprises a signal generating device that generates a detection signal, a signal receiving device that receives and processes the detection signal, and a control device. The detection signal that is used for testing the array substrate having the dense number of wires, and the control device controls one or more of the signal generating device and the signal receiving device to move in a direction perpendicular to a direction of a scan line of the array substrate and in a plane parallel to the array substrate.

Furthermore, the signal generating device comprises a signal input unit, and the signal receiving device comprises a signal output unit. The signal input unit sends the detection signal generated by the signal generating device to a scan line to be detected, the signal output unit sends the detected detection signal, and the signal input unit and die signal output unit are controlled by the control device to be moved and positioned. The test device of the present disclosure is different to a typical line testing device, the input sensor and the output sensor of the typical line testing device move in a direction parallel to the direction of the scan line of the array substrate. The line testing device of the present disclosure can make the input sensor and the output sensor of the line testing device move in directions parallel and perpendicular to the direction of the scan line of the array substrate, which can be used for the array substrate having more types of wirings.

Furthermore, the control device comprises a horizontal control device and a perpendicular control device. The horizontal control device controls one or more of the signal generating device and the signal receiving device to move in a direction parallel to a direction of the scan line of the array substrate, the perpendicular control device controls one or more of the signal generating device and the signal receiving device to move in the direction perpendicular to the direction of the scan line of the array substrate, and the horizontal control device and the perpendicular control device independently work. In the present disclosure, the signal generator and the signal receiving device of the line testing, device move in the direction parallel or perpendicular to the direction of the scan line of the array substrate, which makes the line testing device not only be used for wiring the array substrate in a same horizontal line or a same vertical line, but also be used for wiring the array substrate in different horizontal lines or different vertical lines.

Furthermore, the horizontal control device comprises a horizontal balance bar, the perpendicular control device comprises a perpendicular balance bar, and the perpendicular balance bar and the horizontal balance bar are in removable connection with each other. In the present disclosure, the perpendicular control device or the horizontal control device can be moved and positioned according to the horizontal balance bar or the perpendicular balance bar in the direction perpendicular to the direction of the scan line of the array substrate or in the direction parallel to the direction of the scan line of the array substrate. Thus, the input sensor and the output sensor can inclined be moved through simultaneously moving in the directions parallel and perpendicular to the direction of the scan line of the array substrate, and tilted amplitude can be adjusted. Thus, the line testing device of the present disclosure can be used for the array substrate having the dense number of wires.

Furthermore, the horizontal balance bar comprises a rack or a slideway, and the perpendicular balance bar comprises a slideway or a rack that corresponds to the rack or the slideway of the horizontal balance bar. The horizontal balance bar or the perpendicular balance bar comprises a detection table, and the signal generating device and the signal receiving device are arranged at different detection tables. In the present disclosure, the detection signal generated by the signal generating device can be positioned to the scan line to be detected through the detection table in multi-directions, and the detection signal after being tested is sent to signal receiving device, where the signal generating device and the signal receiving device are arranged at a same scan line of the array substrate or different scan lines of the array substrate, which makes the line testing device of the present disclosure be used for the array substrate having multi-types of wring, thus, the line testing device can be used when the different types of array substrate is tested, thereby reducing costs.

Furthermore, the horizontal balance bar and the perpendicular balance bar comprise a scale and a lock screw that locks the perpendicular balance bar and the horizontal balance bar. The control device is driven by power, when only a power-driven control is used, and a position of the perpendicular control device or the horizontal control device may not be eligible for requirement of position. Thus, the scale and the lock screw that is manually controlled are arranged. Combined with the scale and the lock screw, the line testing device is accurately position under the power-driven control and the manual control. Combined with the scale and the lock screw, when the line testing device is fixed and calibrated, the line testing device obtains good calibration effect under the manual control.

Furthermore, the signal generating device comprises a signal input unit configured with an input sensor, and the signal receiving device comprises a signal output unit configured with an output sensor. The input sensor sends the detection signal generated by the signal generating device to a scan line to be detected, the output sensor sends the detected detection signal, and the input sensor and the output sensor are controlled by the control device to be moved and positioned. The control device comprises at least two perpendicular control devices and at least one horizontal control device, the perpendicular control device comprises a perpendicular balance bar, and the horizontal control device comprises a horizontal balance bar. The horizontal balance bar is configured with a rack or a slideway, the perpendicular balance bar is configured with a slideway or a rack that corresponds to the rack or the slideway of the horizontal balance bar. The two perpendicular balance bars are arranged on the horizontal balance bar through a mating of the rack and the slideway, and horizontally move and position. The horizontal balance bar and the perpendicular balance bar comprise a scale and a lock screw that locks the perpendicular balance bar and the horizontal balance bar. The perpendicular control device extends outward from a mating site of the perpendicular control device and the horizontal control device to form an elongation portion, and a gravity balance member is arranged on the elongation portion to avoid inclination of the perpendicular balance bar. The two perpendicular control devices further comprise a detection table, and the input sensor and the output sensor are arranged at different detection table. The input sensor and the output sensor are close to the scan line to be detected, and a capacitor is generated, and the detection signal is sent to the scan line to be detected with non-contact. The detection signal is inserted to one end of the line to be detected through strong position, and the other lines close to the line detected are not switched in a testing circuit, which improves testing efficiency. In a prior art, two lines are switched in the testing circuit to make the problem not be found, however the two lines switched in the testing circuit attach to each other, thus, the current, the voltage, and other signals between the two lines interfere each other, which affects the detection. The line testing device of the present disclosure can be controlled by the power-driven control and the manual control, combined with the power-driven control and the manual control, the line testing device can be used for the array substrate having multi-types of wiring. The perpendicular control device is arranged on the horizontal control device, thus, pressure is generated at the mating site of the perpendicular control device and the horizontal control device, namely the mating site of the rack and the slideway, if a center of the gravity of the perpendicular control device is not at the horizontal control device, the pressure generated at the mating site increases due to lever law, and a rake may be formed at the mating site because of inclination of the perpendicular control device. Thus, a contact face of the mating site reduces, and pressure intensity increases, which is prone to damage the mating site. The present disclosure provides the gravity balance member to make the center of the gravity of the perpendicular control device be at the horizontal control device, which avoids formation of the rake, reduces the pressure intensity, and improves work life of the line testing device.

A method for testing a line of an array substrate having a dense number of wires, comprises:

arranging an array substrate on a line testing device to be detected, and adjusting a position and calibration of the line testing device;

making one or more of a signal generating device and a signal receiving device move in a direction perpendicular to a direction of a scan line of the array substrate and in a plane parallel to the array substrate, and forming one circuit between an input sensor of the signal generating device and an output sensor of the signal receiving device through single line of the array substrate; and analyzing the detection signal received by the signal receiving device, and comparing the detection signal with an original detection signal; if result of the comparison is more than of equal to a preset deviation threshold, the single line detected is abnormal, if the result of the comparison is less than the preset deviation difference, the single line detected is normal.

When the array substrate having the dense number of wires is tested through a typical testing method, the signal generating device and the signal receiving device are arranged at two ends of a same scan line, and do not separate in the direction perpendicular to the direction of the scan line, which form the circuit of the charge line and the circuit of sharing line. If one of the charge line and the sharing line is abnormal, the line testing device cannot find the problem. However, the current, the voltage, and the electromagnetism of the scan line affect each other because the charge line attaches to the sharing line, which may cause a fluctuation of the detection signal, and affects the detection. In the present disclosure, the signal generating device and the signal receiving device are arranged at two different scan lines, thus, one circuit is formed when tested, which ensures the result of testing the array substrate having the dense number of wires to be correct. The present disclosure is also used for the array substrate having wiring of N+X scan lines through adjusting a distance between the signal generating device and the signal receiving device in the direction perpendicular to the direction of the scan line, which reduces costs when using the array substrate having different wiring.

Furthermore, the array substrate having the dense number of wires comprises a plurality of scan lines, each of the scan lines comprises a charge line and a sharing line adjacent to the sharing line, and the sharing line is connected to the charge line of one of other scan lines. The method for testing the sharing line comprises:

arranging the signal generating device and the signal receiving device at two sides of the scan line of the array substrate, and coupling the signal receiving device to the sharing line of the scan line to be detected; and moving the signal generating device, and coupling the signal generating device to the charge line of one of other scan lines connected to the sharing line to be detected.

The above-mentioned method avoids simultaneously detecting two circuits, and makes the detection signal not be generated in the charge line attaching to the sharing line detected. Thus, the sharing line detected is not interfered by other detection signals, which improves testing precision and reliability.

Furthermore, the array substrate having the dense number of wires comprises a plurality of scan lines, each of the scan lines comprises a charge line and a sharing line adjacent to the charge line, and the sharing line is connected to the charge line of one of other scan lines. The method for testing the charge line comprises:

arranging the signal generating device and the signal receiving device at two sides of the scan line of the array substrate, and coupling the signal receiving device to the charge line of the scan line be detected; and moving the signal generating device, and coupling the signal generating device to the sharing line of one of other scan lines connected to the charge line to be detected.

The above-mentioned method separates the input sensor and the output sensor, avoids simultaneously detecting two circuits, and makes the detection signal not be generated in the sharing line attaching to the charge line detected. Thus, the charge line detected is not interfered other detection signals, which improves testing precision and reliability.

It should be understood, when the typical line testing device is used to test the array substrate having the dense number of wires, more than two circuits may be formed because of the dense number of wires. If one of the circuits is not normal, and other circuits are normal, the circuit having the problem may not be found. If the circuits are normal, a fluctuation of the detection signal may be generated through influence of voltages, circuit, and the detection signal in the lines, which affects the detection. For the array substrate having the dense number of wires, the inventors further find that two adjacent lines can be connected to other lines along the direction perpendicular to the direction of the scan line of the array substrate. Thus, the present disclosure provides the control device, the control device controls the signal generating device and the signal receiving device to be coupled to two ends of the scan line to be detected, and the signal generating device or the signal receiving device is moved to one of other scan lines coupled to the scan line to be detected, which avoids the signal receiving device and the signal generating device to be coupled to two adjacent lines. Separation of the signal receiving device and the signal generating device can ensure that only one circuit is formed, which improves testing accuracy.

DETAILED DESCRIPTION

Figure 1:
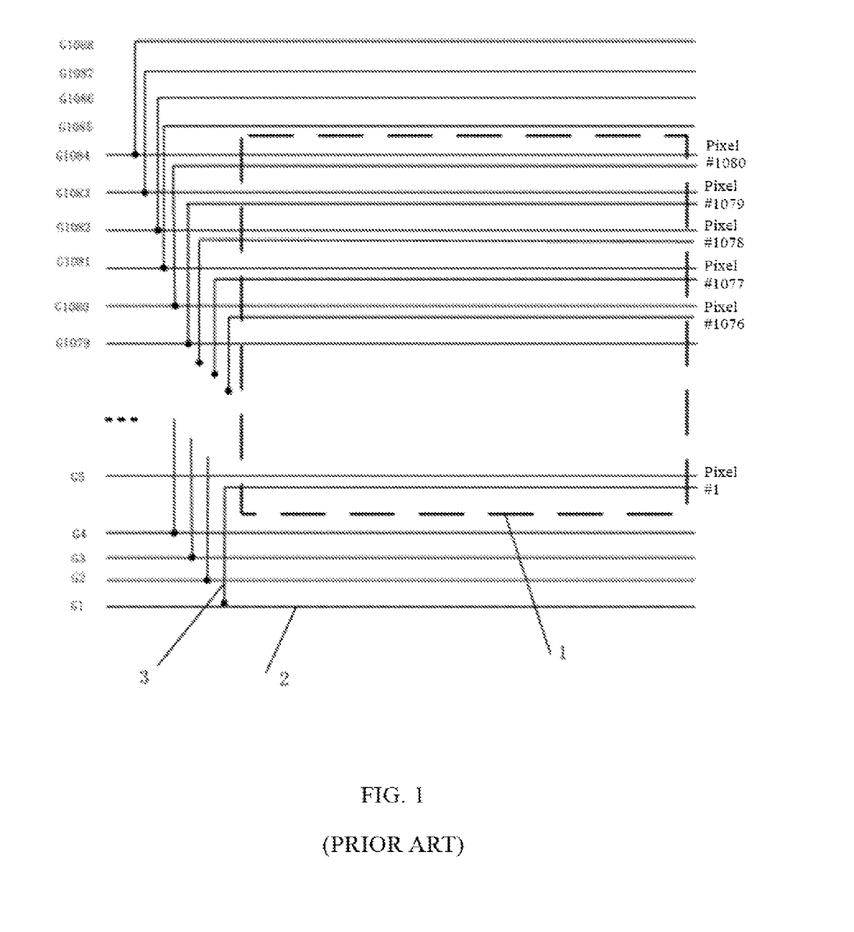
FIG. 1 is a wiring pattern of a typical array substrate having wiring of N+4 scan lines.

FIG. 1 is a wiring pattern of an array substrate having wiring of N+4 scan lines, where the array substrate has a dense number of wires. As shown in FIG. 1, the array substrate comprises a display area 1, 1088 scan lines G1-G1088, where each of the scan lines comprises a charge line 2 and a sharing line 3 that are attached to each other. However, the charge line 2 and the sharing line 3 are separated at one of two ends of the scan line. Taking the scan line G5 for example, an entire charge line of the scan line G5 is arranged at a space of the scan line G5, and one end of a sharing line of the scan line G5 is arranged at a space of the scan line G1, namely one end of a sharing line of the scan line GN is arranged at a space of the scan line GN-4. The display area 1 comprises the scan lines G5-G1084, where the scan line G5 is configured with a pixel #1, the scan line G6 is configured with a pixel #2, and so on. Thus, the scan line G1084 is configured with a pixel #1080. The scan lines G1-G4 comprise the charge line, and do not comprise the sharing line. The scan lines G1085-G1088 comprise the sharing line, and do not comprise the charge line. Thus, the scan lines G1-G4 and G1085-G1088 are regarded as redundant scan lines, are arranged for convenient wiring, and are useless for an image display.

Figure 2:
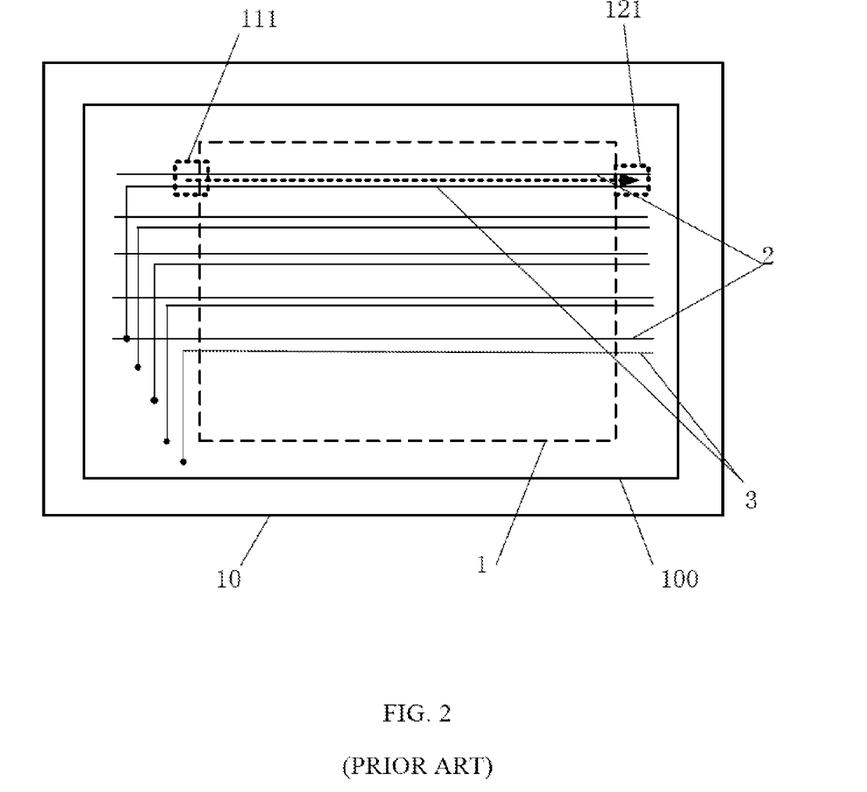
FIG. 2 is a testing diagram of a typical line testing device.

FIG. 2 is a testing diagram of a typical line testing device. The typical line testing device comprises a test board 10, an input sensor 111, and an output sensor 121. The input sensor 111 and the output sensor 121 are arranged on the test board 10. When the scan line is tested, the array substrate 100 is arranged on the typical test board 10, the input sensor 111 of the line testing device is connected to a first end of the scan line, and the output sensor 121 of the line testing device is connected to a second end of the scan line. The input sensor 111 inputs a detection signal of the line testing device into the scan line to be detected, and the output sensor 121 receives the detection signal and sends the detection signal to the line testing device. The input sensor 111 and the output sensor 121 move in a direction parallel to a direction of the scan line, which is good for testing the scan line and determining a bad site of the scan line. However, for the array substrate having the dense number of wires, such as the array substrate having wiring of N+4 scan lines in FIG. 2, when the input sensor 111 and the output sensor 121 are connected to the scan line to be detected, two circuits comprising a circuit of the charge line and a circuit of the sharing line are simultaneously formed because the charge line 2 and the sharing line 3 are attached to each other. If one of the two circuits is not normal, and another circuit is normal, the circuit having a problem may not be found. If the two circuits are normal, the detection signal may be affected by voltages of the two scan lines, circuit of the two scan lines, or a magnetic field generated by the voltages and circuit of the two scan lines, which affects detection, and makes results of the detection incorrect.

The present disclosure will further be described in detail in accordance with the figures and the exemplary examples.

Figure 3:
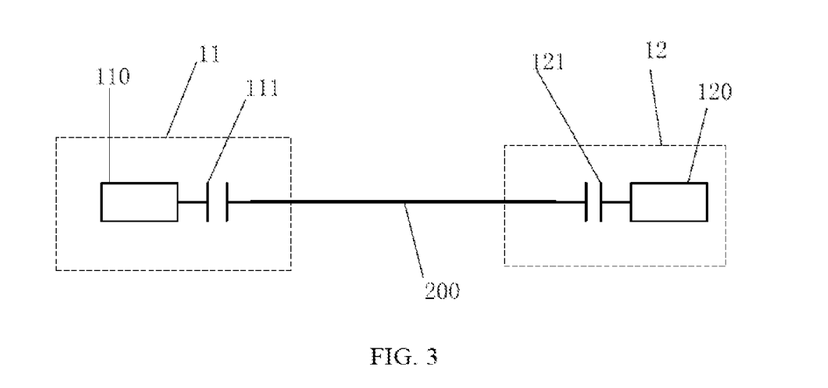
FIG. 3 is a circuit diagram of a line testing device of the present disclosure.
Figure 4:
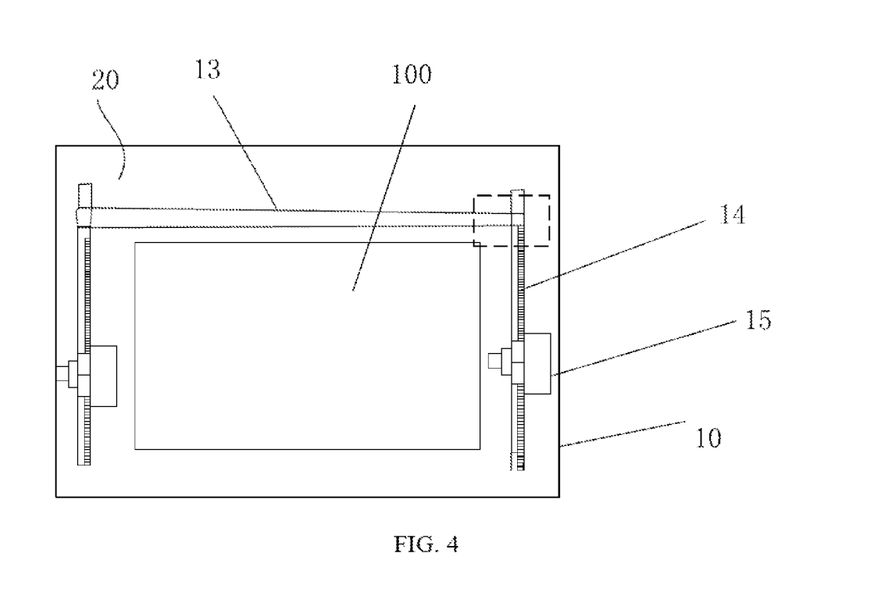
FIG. 4 is a simple diagram of a test board of a line testing device of the present disclosure.
Figure 5:
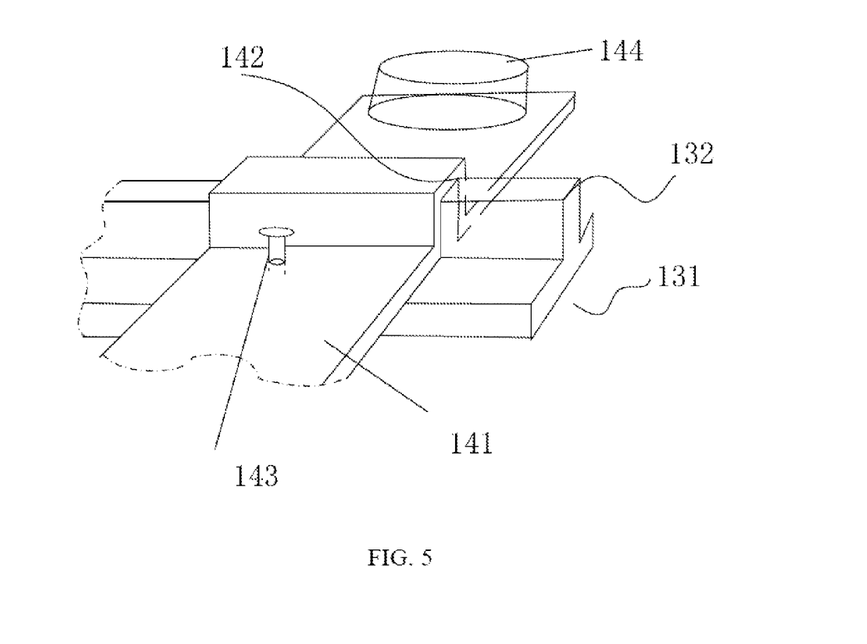
FIG. 5 is a structural diagram of a mating site of a horizontal control device and a perpendicular control device of a line testing device of the present disclosure.

Schematic diagrams of a line testing device for the array substrate having the dense number of wires of the present disclosure are shown from FIG. 3 to FIG. 5.

FIG. 3 is a circuit diagram of the line testing device of the present disclosure, the line testing device comprises a signal generating device 11 that generates the detection signal, a signal receiving device 12 that receives the detection signal and processes the detection signal, and a control device. The detection signal is used for detecting the scan line of the array substrate, and the control device controls one or more of the signal generating device 11 and the signal receiving device 12 to move in a direction perpendicular to the direction of the scan line of the array substrate and in a plane parallel to the array substrate. The signal generating device 11 comprises a signal generator 110 and a signal input unit, the signal input unit is the input sensor 111. The signal receiving device 12 comprises a signal receiver 120 and a signal output unit, the signal output unit is the output sensor 121. The signal generator 110 generates the detection signal used for detecting the scan line, and the input sensor 111 sends the detection signal generated by the signal generator 110 to the scan line 200 to be detected. The output sensor 121 collects the detection signal transferred by the scan line 200 to be detected, and sends the detection signal to the signal receiver 120, the detection signal is analyzed and compared with an original detection signal to obtain a detection result.

When the input sensor and the output sensor non-contact approach the scan line to be detected, a capacitor is generated, and an alternating detection signal having high frequency can be input into the scan line to be detected with non-contact.

The signal receiving device receives the detection signal, and analyzes and determines the detection signal. It should be understood that the input sensor and the output sensor also may be connected to the scan line to be detected in contact under proper conditions.

FIG. 4 is a simple diagram of the line testing device of the present disclosure, combined with the FIG. 3, the test board 10 comprises the signal generating device 11, the signal receiving device 12, and the control device 20. The control device 20 comprises a horizontal control device, a perpendicular control device 14, and a driving assembly (no shown in FIG. 4) connected to the horizontal control device 13 and the perpendicular control device 14. The driving assembly drives the horizontal control device 13 and the perpendicular control device 14 to move. The horizontal control device 13 controls the input sensor 111 and the output sensor 121 to move in the direction parallel to the direction of the scan line of the array substrate, and the perpendicular control device 14 controls the input sensor 111 and the output sensor 121 to move in the direction perpendicular to the direction of the scan line of the array substrate and in the plane parallel to the array substrate. The perpendicular control device 14 is driven by the driving assembly to move along the horizontal control device 13 and in the direction parallel to the scan line of the array substrate 100. The perpendicular control device 14 further comprises a detection table 15, the input sensor 111 and the output sensor 121 are arranged on the detection table 15, and the detection table 15 is driven by the perpendicular control device 14 and the driving assembly to move in the direction perpendicular to the direction of the scan line of the array substrate and in the plane parallel to the array substrate.

At least two perpendicular control devices 14 are arranged on the horizontal control device 13 in parallel, and the perpendicular control device is driven by the driving assembly to move and position along the horizontal control device. At least one horizontal control device 13 is arranged, when two horizontal control devices 13 are arranged, the two horizontal control device 13 are parallelly arranged in a same plane, and connect to one end of each of two perpendicular control devices that are arranged in parallel. It should be understood that positions of the horizontal control device and the perpendicular control device can be exchanged relative to the array substrate, which does not affect to use the line testing device.

Because the perpendicular control device or the horizontal control device can be moved and positioned according to a horizontal balance bar or a perpendicular balance bar in the direction perpendicular to the direction of the scan line of the array substrate or in the direction parallel to the direction of the scan line of the array substrate, the input sensor and the output sensor can inclined move through simultaneously moving in the directions parallel and perpendicular to the direction of the scan line of the array substrate, and tilted amplitude can be adjusted. Thus, the line testing device of the present disclosure can be used for testing the array substrate having the dense number of wires.

In the present disclosure, the detection signal generated by the signal generating device can be positioned to the scan line to be detected through the detection table in multi-directions, and the detected detection signal is sent to signal receiving device, where the signal generating device and the signal receiving device are arranged at a same scan line of the array substrate or different scan lines of the array substrate, which makes the line testing device of the present disclosure be used for testing the array substrate having multi-types of wring, thus, the line testing device can be used when the different types of array substrate is tested, testing costs are reduced.

FIG. 5 is a structural diagram of a mating site of the horizontal control device and the perpendicular control device, combined by the FIG. 4, the horizontal control device 13 comprises the horizontal balance bar 131 and a rack 132, the perpendicular control device comprises the perpendicular balance bar 141 and a slideway 142 that corresponds to the rack 132, and the perpendicular control device 11 move through a mating of the rack 132 and the slideway 142.

The perpendicular control device further comprises a gravity balance member 144 arranged on an elongation portion of the perpendicular balance bar 141, the elongation portion is formed through extending outward the perpendicular balance bar from the mating site of the horizontal control device and the perpendicular control device. The perpendicular control device 14 is arranged on the horizontal control device 13, and pressure is generated at the mating site of the rack 132 and the slideway 142. If a center of gravity of the perpendicular control device 14 is not at the horizontal control device 13, the pressure generated at the mating site increases due to the lever law, and a rake may be formed at the mating site because of inclination of the perpendicular control device 14. Thus, a contact face of the mating site reduces, and pressure intensity increases, which is prone to damage the mating site. The present disclosure provides the gravity balance member to make the center of the gravity of the perpendicular control device be at the horizontal control device, which avoids formation of the rake, reduces the pressure intensity, and improves work life of the line testing device.

The driving assembly connected to the rack 132 and the slideway 142 controls the rack 132 and the slideway 142 to move, and the rack 132 and the slideway 142 may also move through manual control. The perpendicular control device 14 further comprises a lock screw 143 arranged at the mating site of the perpendicular control device 14 and the horizontal control device. The control device is driven by power, when only a power-driven control is used, and the position of the perpendicular control device 14 or the horizontal control device 13 may not be eligible for requirement of position. A combination of the power-driven control, the manual control, and the lock screw 143 can make the line testing device satisfy more requirements.

The horizontal balance bar and the perpendicular balance bar are configured with a scale and the lock screw 143 that is used for locking the perpendicular balance bar and the horizontal balance bar. Combined with the power-driven control and the manual control, the scale is used for zeroing and calibrating better. Combined with the lock screw 143, the scale can position the perpendicular control device 14 and the horizontal control device better.

Figure 6:
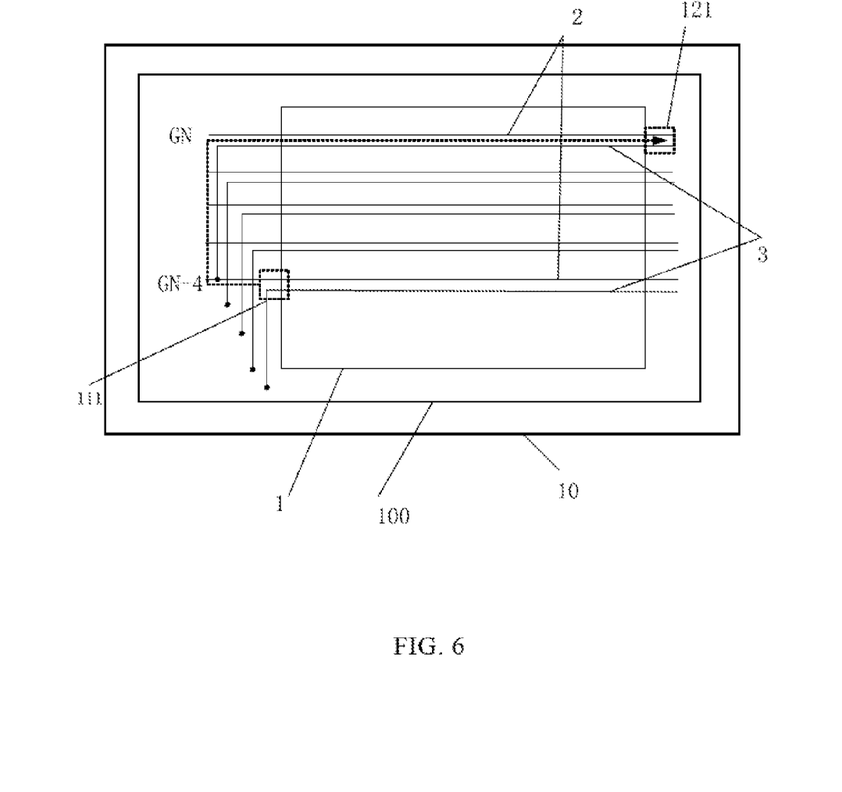
FIG. 6 is a schematic diagram of testing a sharing line of an array substrate having wiring of N+4 scan lines by a line testing device of the present disclosure.

FIG. 6 is a schematic diagram of testing the sharing line of the array substrate having wiring of N+4 scan lines by the line testing device of the present disclosure. The array substrate comprises the plurality of scan lines, and each of the scan lines comprises the charge line and the sharing line adjacent to the charge line, where the sharing line of the scan line GN is connected to the charge line of the scan line GN-4. The scan line GN is used as an example, when the sharing line of the scan line GN is tested, the signal generating device is installed at one end of the charge line 2 of the scan line GN-4 connected to the sharing line 3 of the scan line GN, and the signal receiving device is installed at one end of the sharing line 3 of the scan line GN that is connected to the charge line 2 of the scan line GN-4. Thus, one circuit is formed between the signal generating device and the signal receiving device, the circuit comprises a first section of the sharing line of the scan line GN attached to the charge line of the scan line GN, and a second section of the sharing line of the scan line GN that does not attach to the charge line of the scan line GN and extends from the scan line GN to one end of the scan line GN-4. The input sensor 111 of the signal generating device sends the detection signal to the sharing line to be detected, the output sensor 121 of the signal receiving device receives the detected detection signal, and the signal receiving device analyzes the detected detection signal and compares the detection signal with the original detection signal. If the result of the comparison is more than or equal to a preset deviation threshold, the sharing line is abnormal, if the result of the comparison is less than the preset deviation difference, the sharing line is normal. The present disclosure makes an entire sharing line be in the circuit, thus, the entire sharing line can be tested, if the sharing line is abnormal, and an abnormal site needs be determined, which can be obtained through moving the signal receiving device along the sharing line detected. The above-mentioned testing method separates the input sensor and the output sensor of the line testing device, which avoids simultaneously detecting two circuits. Thus, when the sharing line of the scan line GN is tested, the detection signal is not generate in the charge line of the scan line GN attaching to the sharing line of the scan line GN, and test of the sharing line of the scan line GN does not be interfered by the detection signal, which improves testing precision and reliability. And if the sharing line is abnormal, the input sensor of the signal generating device does not move, only the output sensor of the signal receiving device moves to the input sensor of the signal generating device along the scan line detected, when detection result changes from the abnormal to the normal, the abnormal site can be determined.

Thus, the result of testing the array substrate having the dense number of wires is ensured to be correct. The testing method is also used for the array substrate having wiring of N+X scan lines through adjusting a space between the signal generating device and the signal receiving device in the direction perpendicular to the direction of the scan line, which reduces costs when using the array substrate having different wiring.

Figure 7:
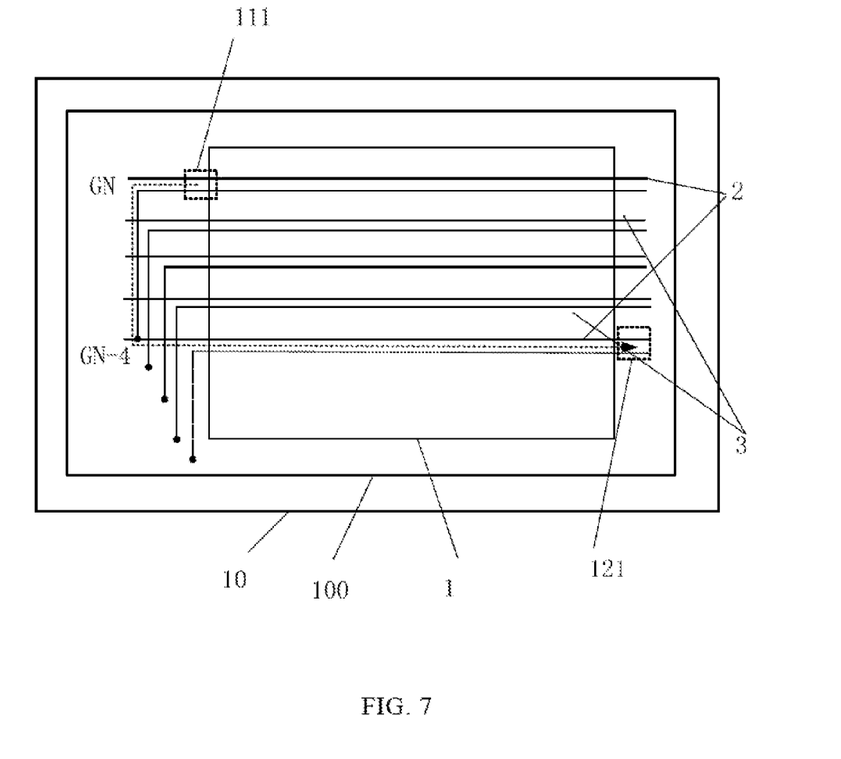
FIG. 7 is a schematic diagram of testing a charge line of an array substrate having wiring of N+4 scan lines by a line testing device of the present disclosure.

FIG. 7 is a schematic diagram of testing the charge line of the array substrate having wiring of N+4 scan lines by the line testing device of the present disclosure. The scan line GN-4 is used as an example, when the charge line of the scan line GN-4 is tested, the signal generating device is installed at one end of the sharing line 3 of the scan line GN connected to the charge line 2 of the scan line GN-4, and the signal receiving device is installed at one end of the charge line 2 of the scan line GN-4 that is connected to the sharing line 3 of the scan line GN. Thus, one circuit is formed between the signal generating device and the signal receiving device, the circuit comprises an entire charge line of the scan line GN-4, and the second section of the sharing line of the scan line GN that does not attach to the charge line of the scan line GN and extends from the scan line GN to one end of the scan line GN-4. The detection signal generated by the signal generating device is sent to the charge line to be detected, the signal receiving device receives the detected detection signal, and the signal receiving device analyzes the detected detection signal and compares the detection signal with the original detection signal. If the result of the comparison is more than or equal to the preset deviation threshold, the sharing line is abnormal, if the result of the comparison is less than the preset deviation difference, the sharing line is normal.

The present disclosure makes the entire charge line be in the circuit, thus, the entire charge line can be tested, if the charge line is abnormal, and the abnormal site needs be determined, which can be obtained through moving the signal receiving device along the charge line detected.

Figure 8:
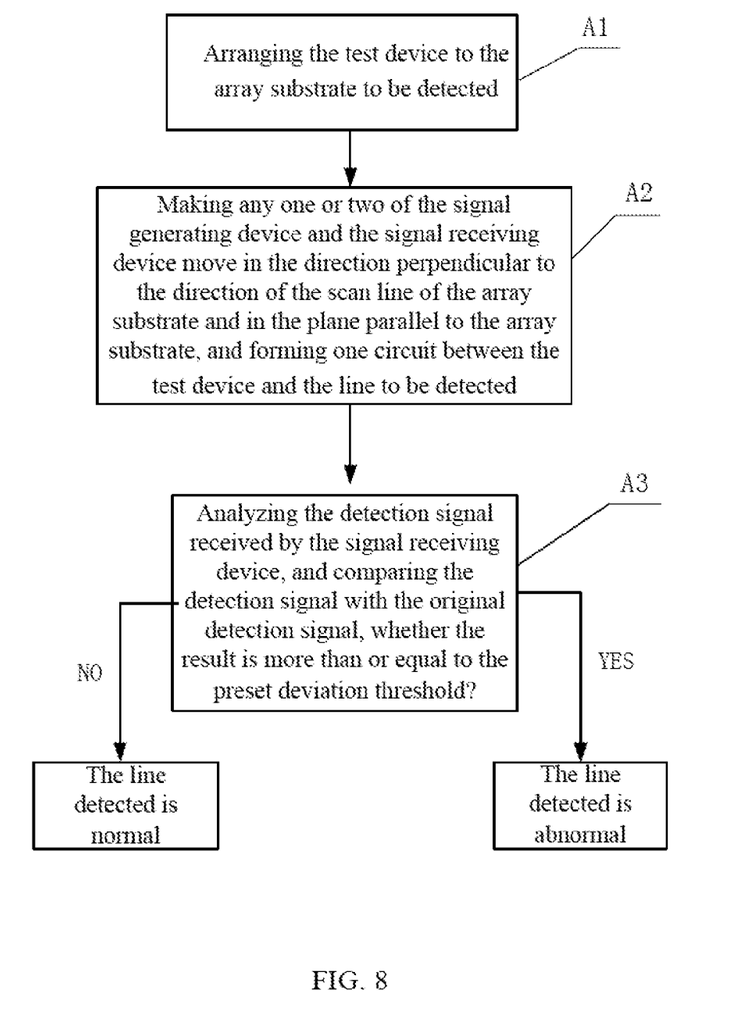
FIG. 8 is a flowchart of a method for testing an array substrate having a dense number of wires of the present disclosure.
Figure 9:
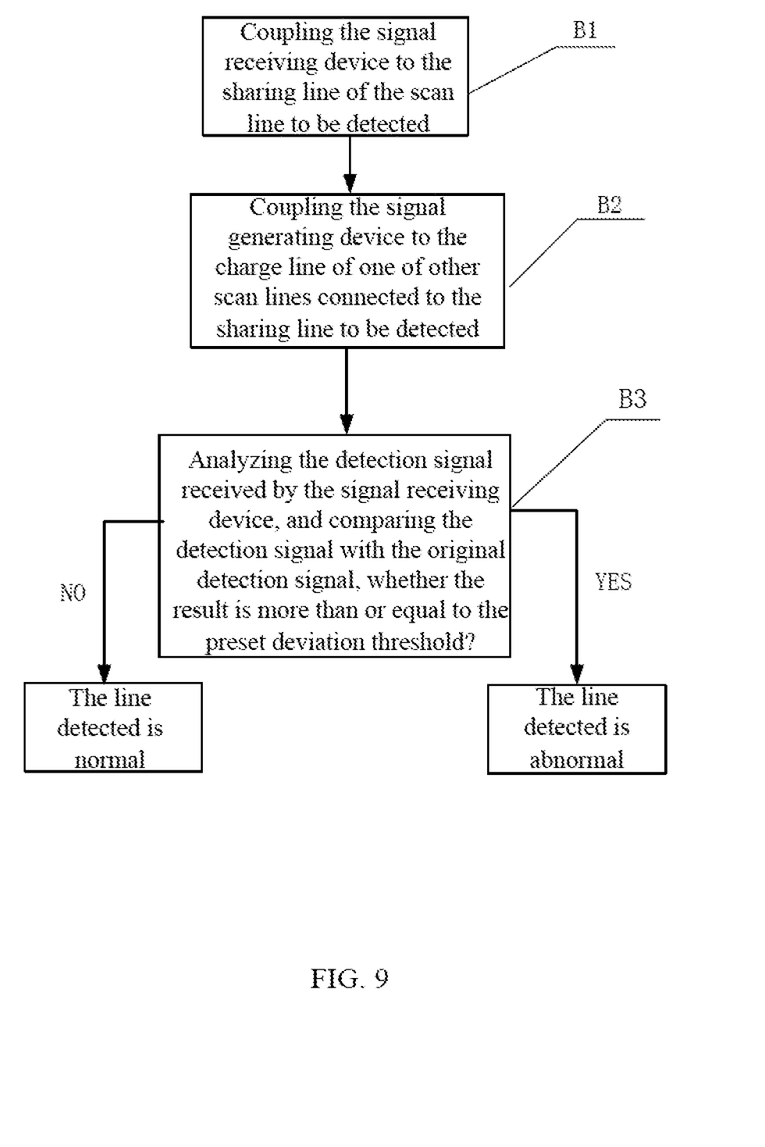
FIG. 9 is a flowchart of a method for testing a sharing line of an array substrate having the dense number of wires of the present disclosure.
Figure 10:
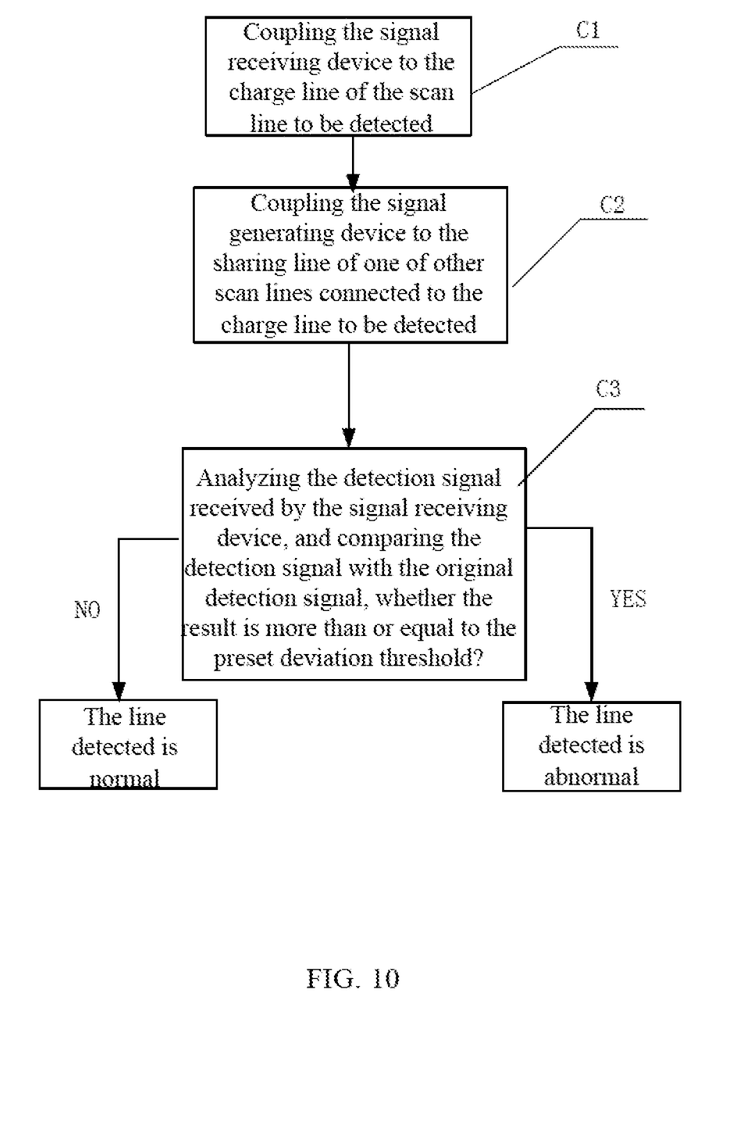
FIG. 10 is a flowchart of a method for testing a charge line of an array substrate having the dense number of wires of the present disclosure.

A flowchart of testing the array substrate having the dense number of wires of the present disclosure is shown in FIGS. 8-10.

A schematic flowchart of testing the array substrate having the dense number of wires of the present disclosure is shown in FIG. 8. The method comprises:

A1: arranging an array substrate on a line testing device to be detected, and adjusting a position and calibration of the line testing device;

A2: making one or more of the signal generating device and the signal receiving device move in the direction perpendicular to the direction of the scan line of the array substrate and in the plane parallel to the array substrate, and forming the circuit between the input sensor of the signal generating device and the output sensor of the signal receiving device through the charge line or the sharing line of the scan line of the array substrate; and A3: analyzing the detection signal received by the signal receiving device, and comparing the detection signal with the original detection signal; if the result of the comparison is more than or equal to the preset deviation threshold, the line detected is abnormal, if the result of the comparison is less than the preset deviation difference, the line detected is normal.

When the array substrate having the dense number of wires is tested through a typical testing method, the signal generating device and the signal receiving device are arranged at two ends of a same scan line, and do not separate in the direction perpendicular to the direction of the scan line, which form the circuit of the charge line and the circuit of sharing line. If one of the charge line and the sharing line is abnormal, the line testing device cannot find the problem. However, the current, the voltage, and the electromagnetism of the scan line affect each other because the charge line attaches to the sharing line, which may cause a fluctuation of the detection signal, and affects the detection. In the present disclosure, the signal generating device and the signal receiving device are arranged at two different scan lines, thus, one circuit is formed when tested, which ensures the result of testing the array substrate having the dense number of wires to be correct. The present disclosure is also used for the array substrate having wiring of N+X scan lines through adjusting a distance between the signal generating device and the signal receiving device in the direction perpendicular to the direction of the scan line, which reduces costs when using the array substrate having different wirings.

FIG. 9 is a flowchart of testing the sharing line of the array substrate having the dense number of wires of the present disclosure. The array substrate having the dense number of wires comprises the plurality of scan lines, each of the scan lines comprises the charge line and the sharing line adjacent to the charge line, and the sharing line is connected to the charge line of one of other scan lines. The method for testing the sharing line comprises:

B1: arranging the signal generating device and the signal receiving device at two sides of the scan line of the array substrate, and coupling the signal receiving device to the sharing line of the scan line to be detected;

B2: moving the signal generating device, and coupling the signal generating device to the charge line of one of other scan lines connected to the sharing line to be detected; and B3: analyzing the detection signal received by the signal receiving device, and comparing the detection signal with the original detection signal; if the result of the comparison is more than or equal to the preset deviation threshold, the sharing line detected is abnormal, if the result of the comparison is less than the preset deviation difference, the sharing line detected is normal.

The above-mentioned method for testing the sharing line of the scan line avoids simultaneously detecting two circuits. Thus, when the sharing line of the scan line is tested, the detection signal is not generated in the charge line of the scan line attaching to the sharing line of the scan line detected, and the sharing line of the scan line detected is not interfered by other detection signals, which improve testing precision and reliability. And if the sharing line is abnormal, the input sensor of the signal generating device does not move, only the output sensor of the signal receiving device moves to the input sensor of the signal generating device along the scan line detected, when the detection result changes from the abnormal to the normal, the abnormal site can be determined.

FIG. 10 is a flowchart of testing the charge line of the array substrate having the dense number of wires of the present disclosure. The array substrate having the dense number of wires comprises a plurality of scan lines, each of the scan lines comprises the charge line and the sharing line adjacent to the charge line, and the sharing line is connected to the charge line of one of other scan lines. The method for testing the charge line comprises:

C1: arranging the signal generating device and the signal receiving device at two sides of the scan line of the array substrate, and coupling the signal receiving device to the charge line of the scan line to be detected;

C2: moving the signal generating device, and coupling the signal generating device to the sharing line of one of other scan lines connected to the charge line to be detected; and C3: analyzing the detection signal received by the signal receiving device, and comparing the detection signal with the original detection signal; if the result of the comparison is more than or equal to the preset deviation threshold, the charge line detected is abnormal, if the result of the comparison is less than the preset deviation difference, the charge line detected is normal.

The above-mentioned testing method separates the input sensor and the output sensor of the line testing device, which avoids simultaneously detecting two circuits. Thus, when the charge line of the scan line is tested, the detection signal is not generated in the sharing line of the scan line attaching to the charge line of the scan line detected, and the charge line of the scan line detected does not be interfered by other detection signals, which improves testing precision and reliability. And if the charge line is abnormal, the input sensor of the signal generating device does not move, only the output sensor of the signal receiving device moves to the input sensor of the signal generating device along the scan line detected, when the detection result changes from the abnormal to the normal, the Abnormal site can be determined.

The present disclosure is described in detail in accordance with the above contents with the specific exemplary examples. However, this present disclosure is not limited to the specific examples. For the ordinary technical personnel of the technical field of the present disclosure, on the premise of keeping the conception of, the technical personnel can also make simple deductions or replacements, and all of which should be considered to belong to the protection scope of the present disclosure.

I claim:

1. A line testing device for an array substrate having a dense number of wires, comprising:
a signal generating device that generates a detection signal;
a signal receiving device that receives and processes the detection signal; and
a control device;
wherein the detection signal tests the array substrate having the dense number of wires, and the control device controls any one or more of the signal generating device and the signal receiving device to move in a direction perpendicular to a direction of a scan line of the array substrate and in a plane parallel to the array substrate, wherein the control device comprises a horizontal control device and a perpendicular control device; the horizontal control device controls one or more of the signal generating device and the signal receiving device to move in a direction parallel to a direction of the scan line of the array substrate, the perpendicular control device controls one or more of the signal generating device and the signal receiving device to move in the direction perpendicular to the direction of the scan line of the array substrate, and the horizontal control device and the perpendicular control device independently work, and the perpendicular control device further comprises a gravity balance member arranged on an elongation portion of the perpendicular balance bar.

2. The line testing device for the array substrate having the dense number of wires of claim 1, wherein the signal generating device comprises a signal input unit, and the signal receiving device comprises a signal output unit; the signal input unit sends the detection signal generated by the signal generating device to a scan line to be detected, the signal output unit sends the detected detection signal, and the signal input unit and the signal output unit are controlled by the control device to be moved and positioned.

3. The line testing device for the array substrate having the dense number of wires of claim 1, wherein the horizontal control device comprises a horizontal balance bar, the perpendicular control device comprises a perpendicular balance bar, and the perpendicular balance bar and the horizontal balance bar are in removable connection with each other.

4. The line testing device for the array substrate having the dense number of wires of claim 3, wherein the horizontal balance bar comprises a rack or a slideway, and the perpendicular balance bar comprises a slideway or a rack that corresponds to the rack or the slideway of the horizontal balance bar the horizontal balance bar or the perpendicular balance bar comprises a detection table, the signal generating device and the signal receiving device are arranged at different detection tables.

5. The line testing device for the array substrate having the dense number of wires of claim 3, wherein the horizontal balance bar and the perpendicular balance bar comprise a scale and a lock screw that locks the perpendicular balance bar and the horizontal balance bar.

6. The line testing device for the array substrate having the dense number of wires of claim 1, wherein the signal generating device comprises a signal input unit configured with an input sensor, and the signal receiving device comprises a signal output unit configured with an output sensor; the input sensor sends the detection signal generated by the signal generating device to a scan line to be detected, the output sensor sends the detected detection signal, and the input sensor and the output sensor are controlled by the control device to be moved and positioned; the control device comprises at least two perpendicular control devices and at least one horizontal control device, the perpendicular control device comprises a perpendicular balance bar, and the horizontal control device comprises a horizontal balance bar; the horizontal balance bar is configured with a rack or a slideway, the perpendicular balance bar is configured with a slideway or a rack that corresponds to the rack or the slideway of the horizontal balance bar; the two perpendicular balance bars are arranged on the horizontal balance bar through a mating of the rack and the slideway, and horizontally move and position; the horizontal balance bar and the perpendicular balance bar comprise a scale and a lock screw that locks the perpendicular balance bar and the horizontal balance bar; the perpendicular control device extends outward from a mating site of the perpendicular control device and the horizontal control device to form an elongation portion, and a gravity balance member is arranged on the elongation portion to avoid inclination of the perpendicular balance bar; the two perpendicular control device further comprise a detection table, and the input sensor and the output sensor are arranged at different detection table; the input sensor and the output sensor are close to the scan line to be detected, and a capacitor is generated, and the detection signal is sent to the scan line to be detected with non-contact.

7. A method for testing a line of an array substrate having a dense number of wires, comprising:

arranging an array substrate on a line testing device to be detected, and adjusting a position and calibration of the line testing device;

making one or more of a signal generating device and a signal receiving device move in a direction perpendicular to a direction of a scan line of the array substrate and in a plane parallel to the array substrate by a control device, the control device comprises a horizontal control device and a perpendicular control device; the horizontal control device controls one or more of the signal generating device and the signal receiving device to move in a direction parallel to a direction of the scan line of the array substrate, the perpendicular control device controls one or more of the signal generating device and the signal receiving device to move in the direction perpendicular to the direction of the scan line of the array substrate, and the horizontal control device and the perpendicular control device independently work, and the Perpendicular control device further comprises a gravity balance member arranged on an elongation portion of the perpendicular balance bar, and forming one circuit between an input sensor of the signal generating device and an output sensor of the signal receiving device through single line of the array substrate; and analyzing the detection signal received by the signal receiving device, and comparing the detection signal with an original detection signal; if result of the comparison is more than or equal to a preset deviation threshold, the single line detected is abnormal, if the result of the comparison is less than the preset deviation difference, the single line detected is normal.

8. The method for testing the line of the array substrate having the dense number of wires of claim 7, wherein the array substrate having the dense number of wires comprises a plurality of scan lines, each of the scan lines comprises a charge line and a sharing line adjacent to the charge line, and the sharing line is connected to the charge line of one of other scan lines; the method comprises:

arranging the signal generating device and the signal receiving device at two sides of the scan line of the array substrate, and coupling the signal receiving device to the sharing line of the scan line to be detected; and moving the signal generating device, and coupling the signal generating device to the charge line of one of other scan lines connected to the sharing line to be detected.

9. The method for testing the line of the array substrate having the dense number of wires of claim 7, wherein the array substrate having the dense number of wires comprises a plurality of scan lines, each of the scan lines comprises a charge line and a sharing line adjacent to the charge line, and the sharing line is connected to the charge line of one of other scan lines; the method comprises:

arranging the signal generating device and the signal receiving device at two sides of the scan line of the array substrate, and coupling the signal receiving device to the charge line of the scan line to be detected; and moving the signal generating device, and coupling the signal generating device to the sharing line of one of other scan lines connected to the charge line to be detected.

* * * * *